United States Patent
Chan et al.

(10) Patent No.: US 6,448,594 B1
(45) Date of Patent: Sep. 10, 2002

(54) METHOD AND SYSTEM FOR PROCESSING A SEMICONDUCTOR DEVICE

(75) Inventors: Maria C. Chan, San Jose; Hao Fang, Cupertino; Lu You, Santa Clara; Mark S. Chang, Los Altos; King Wai Kelwin Ko, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/539,307

(22) Filed: Mar. 30, 2000

(51) Int. Cl.$^7$ .................. H01L 29/76; H01L 27/88
(52) U.S. Cl. ............... 257/288; 257/368; 257/412; 257/413; 257/900
(58) Field of Search ................... 257/202, 204, 257/288, 305, 349, 389, 395, 401, 406, 499, 501, 506, 524, 537, 900

(56) References Cited

U.S. PATENT DOCUMENTS

| | | | |
|---|---|---|---|
| 5,905,293 A | * 5/1999 | Jeng et al. ................ 257/408 |
| 5,914,498 A | * 6/1999 | Suzawa et al. ............. 257/66 |
| 5,950,104 A | * 9/1999 | Linliu .................... 438/640 |
| 5,962,897 A | * 10/1999 | Takemura et al. ......... 257/347 |
| 6,057,581 A | * 5/2000 | Doan ..................... 257/401 |
| 6,133,074 A | * 10/2000 | Ishiwa et al. ............. 438/153 |
| 6,218,251 B1 | * 4/2001 | Kadosh et al. ............. 438/303 |

OTHER PUBLICATIONS

Wolf, S., "Silicon Processing for the VLSI Era", vol. 3—"The Submicron MOSFET", Lattice Press, Sunset Beach, California (1995), Chapter 9, pp. 634–636.*

* cited by examiner

Primary Examiner—Nathan J. Flynn
Assistant Examiner—Johannes P. Mondt
(74) Attorney, Agent, or Firm—Sawyer Law Group LLP

(57) ABSTRACT

In a first aspect of the present invention, a semiconductor device is disclosed. The semiconductor device comprises at least two gate stacks, each gate stack having two sides and oxide spacers on each of the two sides of each of the at least two gate stacks, wherein at least one of the oxide spacers is triangular shaped. In a second aspect of the present invention, a method and system for processing a semiconductor device is disclosed. The method and system for processing a semiconductor comprise forming at least two gate stacks over a semiconductor substrate, depositing an oxide layer over the at least two gate stacks, and etching the oxide layer to form at least one oxide spacer in between the at least two gate stacks, wherein the at least one oxide spacer is triangular shape. Through the use the present invention, the voids that are created in the semiconductor device during conventional semiconductor processing are eliminated. This is accomplished by creating oxide spacers having a triangular shape when etching the oxide layer to form the oxide spacer. By creating a triangular shaped oxide spacer, subsequent layers of material can be deposited over the oxide spacer without creating voids in the semiconductor device. Accordingly, as a result of the use of the present invention, the oxide spacers are strengthened, which increases the reliability of the semiconductor device.

1 Claim, 4 Drawing Sheets

METHOD AND SYSTEM FOR PROCESSING A SEMICONDUCTOR DEVICE

FIELD OF INVENTION

The present invention relates generally to semiconductor devices and more specifically to a method and system for processing a semiconductor device.

BACKGROUND OF THE INVENTION

Semiconductor manufacturers have increasingly turned to high density Metal Oxide Semiconductor (MOS) arrays in their integrated circuit design schemes. To achieve a high density integrated circuit, features such as metal-oxide semiconductor field-effect transistors (MOSFETs) must be as small as possible. Typically, high density flash memory integrated circuits utilize NAND-type gates as opposed to NOR-type gates since NAND gates have a considerably higher density than NOR gates. Smaller transistors allow more transistors to be placed on a single substrate, thereby allowing relatively large circuit systems to be incorporated on a single, relatively small die area.

FIG. 1 illustrates a cross section of two conventional MOSFET cells. The cells 100 and 150 are comprised of gate stacks 102, 106 on a substrate 108. To prevent charge leakage, oxide spacers 110 are formed on each side of the gate stacks 102, 106. These oxide spacers 110 are separated by a spacer gap 104 and are typically formed using a conventional chemical vapor deposition (CVD) methodology.

As dimensions are reduced in each new generation of integrated circuit, the spacer gaps are smaller (0.32 microns or lower). The subsequent deposition of material over the oxide spacers becomes increasingly problematic as the spacer gap size decreases. To further illustrate this problem, please refer to FIG. 2.

FIG. 2 illustrates a semiconductor device wherein material 160 (i.e. Tetraethyl Orthosilicate) deposited over the gate stacks 102, 106 is unable to get in the smaller spacer. gap 104' due to the rectangular shape of the oxide spacers 110. A void 170 is thereby created. These voids are the result of the inability of the material 160 to get around the edges 112 of the rectangular shaped oxide spacers 110. Voids create weaknesses in the oxide spacers 110 thereby reducing the reliability of the device. Consequently, by utilizing conventional techniques, material that is subsequently deposited over the oxide spacers 110 cannot adequately fill the spacer gaps.

Accordingly, what is needed is a method for eliminating voids in the spacer gaps of semiconductor devices. The present invention addresses such a need.

SUMMARY OF THE INVENTION

In a first aspect of the present invention, a semiconductor device is disclosed. The semiconductor device comprises at least two gate stacks, each gate stack having two sides and oxide spacers on each of the two sides of each of the at least two gate stacks, wherein at least one of the oxide spacers is triangular shaped.

In a second aspect of the present invention, a method and system for processing a semiconductor device is disclosed. The method and system for processing a semiconductor comprise forming at least two gate stacks over a semiconductor substrate, depositing an oxide layer over the at least two gate stacks, and etching the oxide layer to form at least one oxide spacer in between the at least two gate stacks, wherein the at least one oxide spacer is triangular shape.

Through the use the present invention, the voids that are created in the semiconductor device during conventional semiconductor processing are eliminated. This is accomplished by creating oxide spacers having a triangular shape when etching the oxide layer to form the oxide spacer. By creating a triangular shaped oxide spacer, subsequent layers of material can be deposited over the oxide spacer without creating voids in the semiconductor device. Accordingly, as a result of the use of the present invention, the oxide spacers are strengthened, which increases the reliability of the semiconductor device.

DETAILED DESCRIPTION OF THE INVENTION

The present invention provides a method and system for processing a semiconductor. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The method and system in accordance with the present invention is described in the context of a preferred embodiment. The preferred embodiment creates a triangular shaped oxide spacer when etching the oxide layer to form the oxide spacer. By creating a triangular shaped oxide spacer, subsequent layers of material can be deposited over the oxide spacer without creating voids in the semiconductor device. Accordingly, as a result of the use of the method in accordance with the present invention, the oxide spacers are strengthened, which increases the reliability of the semiconductor device.

Figure 1:
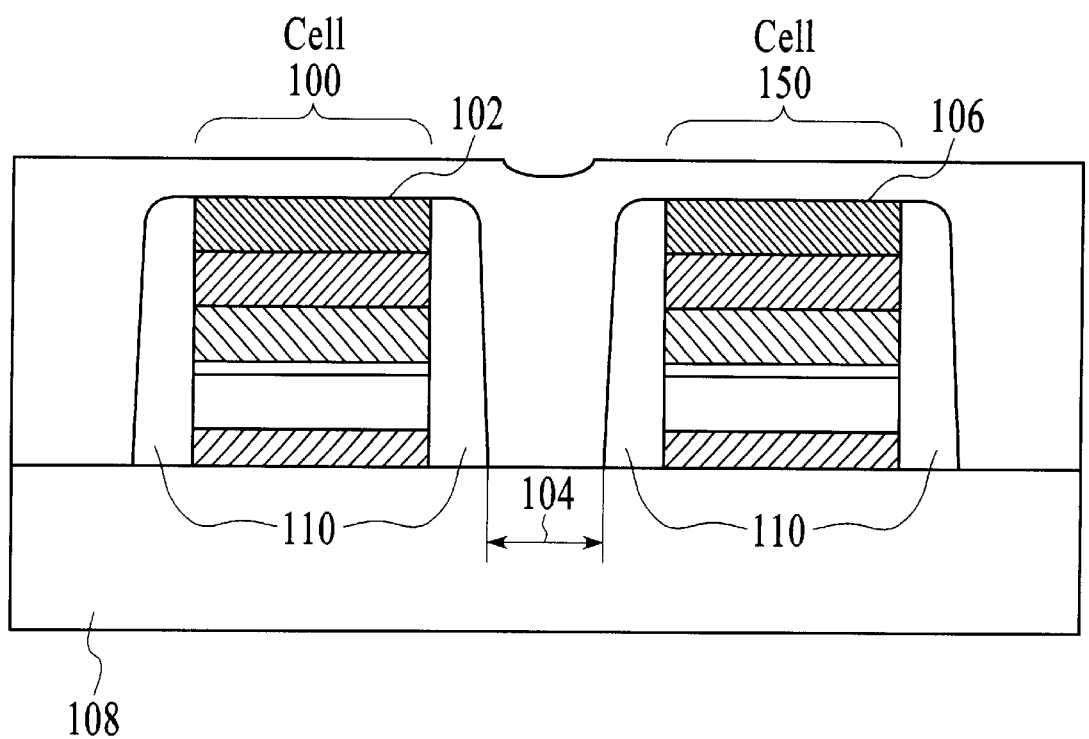
FIG. 1 is a cross section of two conventional MOSFET cells.
Figure 2:
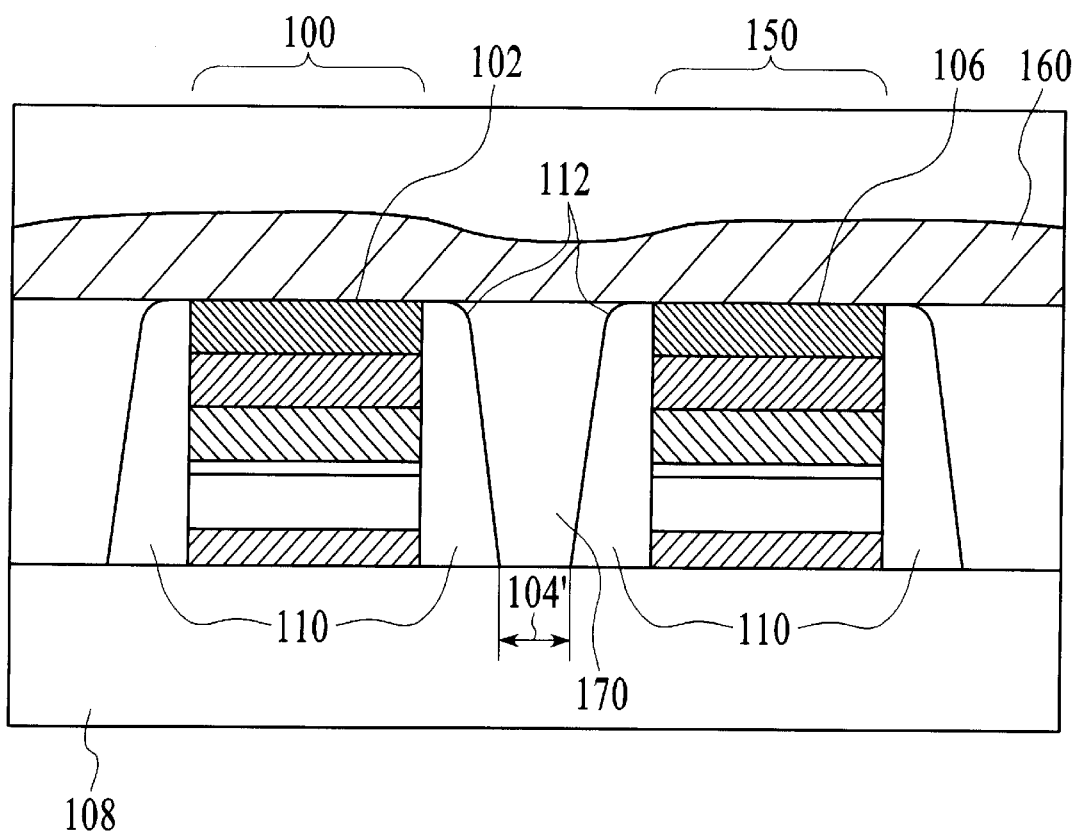
FIG. 2 illustrates a semiconductor device wherein a void has formed.
Figure 3:
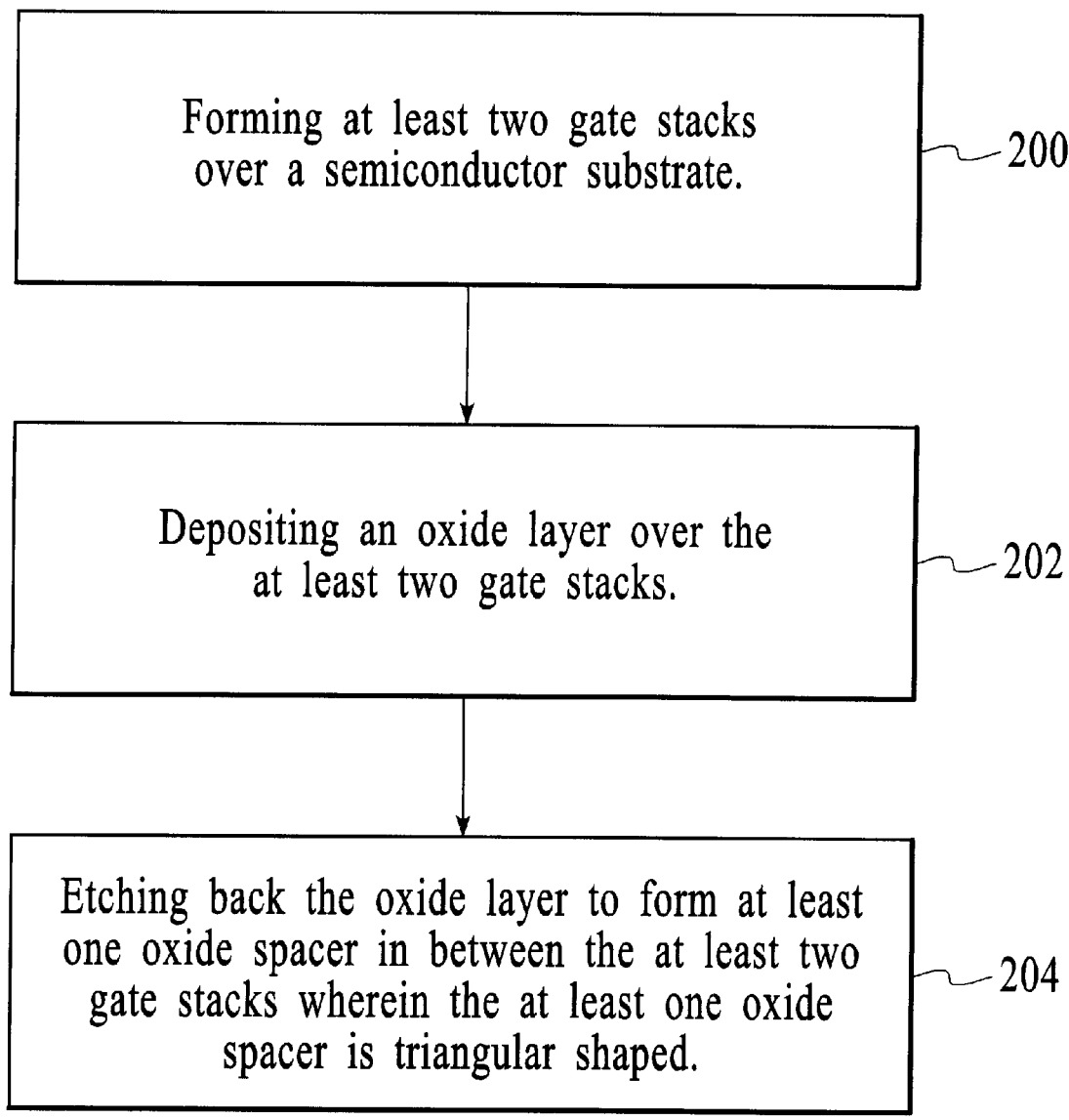
FIG. 3 is a flowchart of the method in accordance with the present invention.

To further describe the method in accordance with the present invention, refer now to FIG. 3. FIG. 3 is a high-level flowchart of the method in accordance with the present invention. First, at least two gate stacks are formed over a semiconductor substrate, via step 200. Next, an oxide layer is deposited over the at least two gate stacks, via step 202. Finally, the oxide layer is etched back to form at least one oxide spacer in between the at least two gate stacks, wherein the oxide spacer is triangular shape, via step 204.

Figure 4:
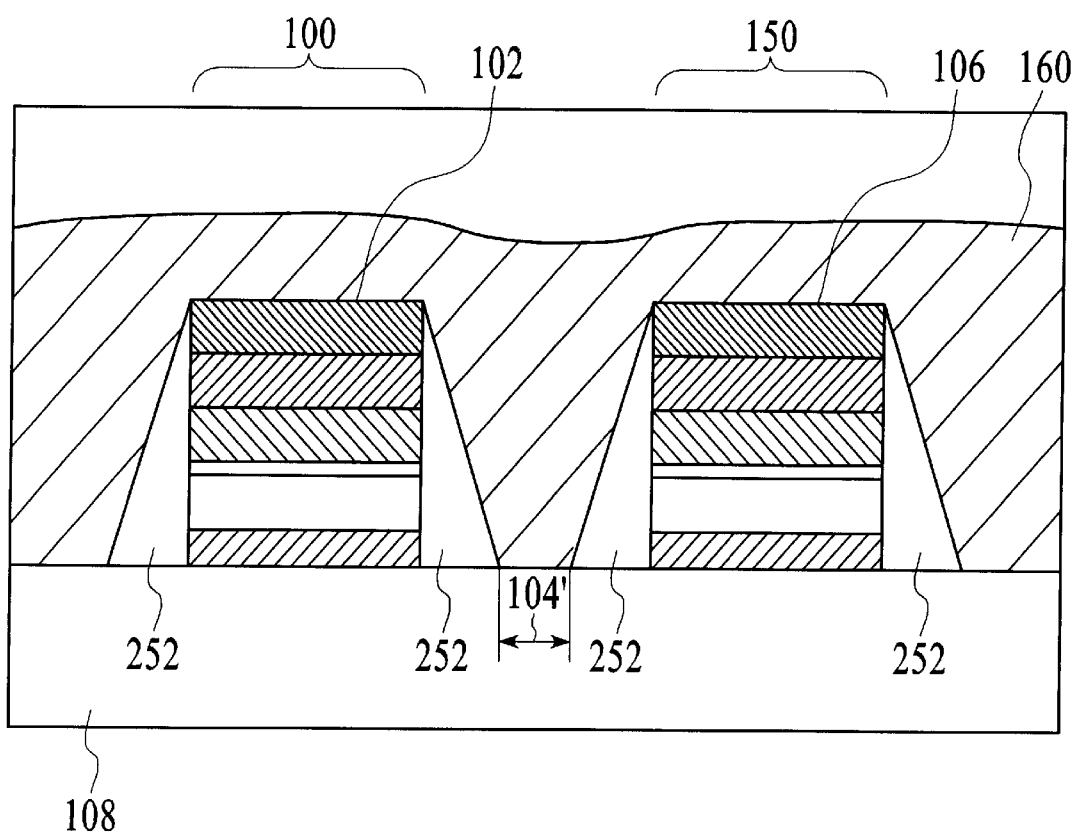
FIG. 4 is a MOSFET cell configuration in accordance with the present invention.

By creating an oxide spacer profile that has a triangular shape, the subsequent deposition of materials over the oxide spacer is less likely to cause the formation of a void in the semiconductor device. FIG. 4 shows a MOSFET cell configuration in accordance with the present invention wherein the oxide spacers 252 are triangular shaped. Accordingly, material 160 subsequently deposited over the gate stacks 102, 106 is able to adequately fill the spacer gap 104'.

The triangular shaped oxide spacer is preferably created by utilizing a high pressure etching process. In a preferred embodiment of the method in accordance with the present invention, the high pressure etching process employs a gas comprising argon, $CF_4$, and $CHF_3$. Additionally, the high pressure etching process is performed carefully in order to avoid damaging the underlying substrate.

Although the preferred embodiment of present invention contemplates the use of a high pressure etching process that employs a gas comprising argon, $CF_4$, and $CHF_3$, one of ordinary skill in the art will readily recognize that a variety of high pressure etching processes could be used while remaining within the spirit and scope of the present invention.

Through the use the present invention, the voids that are created in the semiconductor device during conventional semiconductor processing are eliminated. By creating a triangular shaped oxide spacer, subsequent layers of material can be deposited over the oxide spacer without creating voids in the semiconductor device. Accordingly, as a result of the use of the method and system in accordance with the present invention, the oxide spacers are strengthened, which increases the reliability of the semiconductor device.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device comprising:

at least two gate stacks, each gate stack having two sides;

a spacer gap in between the at least two gate stacks wherein the spacer gap is less than 0.32 microns; and single sidewall spacers on each of the two sides of each of the at least two gate stacks, wherein the single sidewall spacers comprise triangular shaped oxide spacers.

* * * * *